US011767594B2

(12) United States Patent
Scheltjens et al.

(10) Patent No.: US 11,767,594 B2
(45) Date of Patent: Sep. 26, 2023

(54) METHOD AND APPARATUS FOR ATMOSPHERIC PRESSURE PLASMA JET COATING DEPOSITION ON A SUBSTRATE (71) Applicant: MOLECULAR PLASMA GROUP SA, Foetz (LU)

(72) Inventors: Gill Scheltjens, Foetz (LU); Régis Heyberger, Foetz (LU); Malek Alnasser, Foetz (LU)

(73) Assignee: MOLECULAR PLASMA GROUP SA, Foetz (LU)

( * ) Notice: Subject to any disclaimer, the term of this patent is extended or adjusted under 35 U.S.C. 154(b) by 353 days.

(21) Appl. No.: 17/251,847

(22) PCT Filed: Jun. 24, 2019

(86) PCT No.: PCT/EP2019/066647
§ 371 (c)(1),
(2) Date: Dec. 14, 2020

(87) PCT Pub. No.: WO2019/243631
PCT Pub. Date: Dec. 26, 2019

(65) Prior Publication Data
US 2021/0254218 A1    Aug. 19, 2021

(30) Foreign Application Priority Data
Jun. 22, 2018    (EP) .................................... 18179354

(51) Int. Cl.
*C23C 16/513* (2006.01)
*B05B 7/22* (2006.01)
(Continued)

(52) U.S. Cl.
CPC .............. *C23C 16/513* (2013.01); *B05B 7/04* (2013.01); *B05B 7/22* (2013.01); *B05B 13/0214* (2013.01);
(Continued)

(58) Field of Classification Search
CPC .............. C23C 4/134; C23C 16/45563; C23C 16/45595; C23C 16/51
See application file for complete search history.

(56) References Cited

U.S. PATENT DOCUMENTS

| 3,707,615 A | 12/1972 | Rotolico et al. |
| 3,914,573 A | 10/1975 | Muehlberger |
| (Continued) | | |

FOREIGN PATENT DOCUMENTS

| CN | 101455127 A | 6/2009 |
| CN | 101619434 A | 1/2010 |
| (Continued) | | |

OTHER PUBLICATIONS

Office Action from corresponding Chinese Application No. 201980041732.6, dated Apr. 22, 2022.
(Continued)

*Primary Examiner* — Joseph A Miller, Jr.
(74) *Attorney, Agent, or Firm* — WORKMAN NYDEGGER (57) ABSTRACT

A method for plasma coating an object includes an object profile, having the steps of: a) manufacturing a replaceable shield comprising a jet inlet, a nozzle outlet and a sidewall extending from the jet inlet to the nozzle outlet, wherein the nozzle outlet includes an edge essentially congruent to at least part of the object profile; b) detachably attaching the replaceable shield to a jet outlet of a plasma jet generator; c) placing the object at the nozzle outlet such that the object profile fits closely to the nozzle outlet edge; d) plasma coating the object with a low-temperature, oxygen-free plasma at an operating pressure which is higher than the atmospheric pressure by providing a plasma jet in the shield via the plasma jet generator and injecting coating precursors in the plasma jet in the shield.

9 Claims, 8 Drawing Sheets (51) Int. Cl.
  *B05B 15/18* (2018.01)
  *B05B 7/04* (2006.01)
  *B05B 13/02* (2006.01)
  *C23C 16/455* (2006.01)
  *H05H 1/28* (2006.01)
  *H05H 1/24* (2006.01)

(52) U.S. Cl.
  CPC ......... *B05B 13/0228* (2013.01); *B05B 15/18* (2018.02); *C23C 16/45563* (2013.01); *H05H 1/28* (2013.01); *H05H 1/2406* (2013.01); *H05H 1/47* (2021.05)

(56) References Cited

U.S. PATENT DOCUMENTS

| | | | |
|---|---|---|---|
| 6,355,312 | B1 | 3/2002 | Förnsel et al. |
| 8,001,927 | B2 | 8/2011 | Dorier et al. |
| 8,877,283 | B2 | 11/2014 | Wu et al. |
| 9,815,075 | B2 | 11/2017 | Krenn |
| 2002/0148560 | A1* | 10/2002 | Carr ............... C04B 41/009 156/345.24 |
| 2003/0098367 | A1 | 5/2003 | Freshour et al. |
| 2004/0050685 | A1* | 3/2004 | Yara ............... C23C 16/4412 422/186.04 |
| 2006/0057016 | A1* | 3/2006 | Kumar ............... B22F 3/105 419/56 |
| 2009/0142514 | A1 | 6/2009 | O'Neill et al. |
| 2009/0314520 | A1 | 12/2009 | Süss-Wolf et al. |
| 2012/0052183 | A1 | 3/2012 | Wu et al. |
| 2014/0061165 | A1* | 3/2014 | Stempfer ........ B23K 15/0086 219/76.16 |
| 2016/0167063 | A1 | 6/2016 | Hawley et al. |
| 2017/0021372 | A1 | 1/2017 | Krenn |
| 2017/0095929 | A1 | 4/2017 | Levy et al. |
| 2017/0259501 | A1 | 9/2017 | Gandhiraman et al. |

FOREIGN PATENT DOCUMENTS

| | | |
|---|---|---|
| CN | 103533738 A | 1/2014 |
| CN | 106660060 A | 5/2017 |
| CN | 107206534 A | 9/2017 |
| EP | 0217399 A2 | 4/1987 |
| EP | 1875785 A1 | 1/2008 |
| GB | 2439934 A | 1/2008 |
| JP | 2007323812 A | 12/2007 |
| JP | 2008130503 A | 6/2008 |
| WO | 03085693 A1 | 10/2003 |
| WO | 2004045777 A1 | 6/2004 |

OTHER PUBLICATIONS

Bailin et al., "Supersonic Flame Spray Technology and Application," National Defense Industry Press, Jul. 31, 2013, 10 pages.
Office Action from European Application No. 19737477.0, dated Nov. 21, 2022.
Office Action from corresponding European Application No. 18179354.8, dated Nov. 22, 2021.
International Search Report and Written Opinion from PCT Application No. PCT/EP2019/066647, dated Sep. 20, 2019.
Extended European Search Report from corresponding Application No. EP18179354.8, dated Dec. 17, 2018.
Russian Office Action in corresponding Russian Patent Application No. 2021100510/05 (000886), dated Nov. 18, 2022.

* cited by examiner

METHOD AND APPARATUS FOR ATMOSPHERIC PRESSURE PLASMA JET COATING DEPOSITION ON A SUBSTRATE

TECHNICAL FIELD

The invention pertains to the technical field of plasma deposition. The invention may therefore pertain to IPC H05H 1/24 and/or IPC B01J 19/08.

BACKGROUND

Coating by plasma deposition offers a number of benefits with respect to other coating techniques, in particular with respect to wet techniques where a coating is applied by subjecting an object to a liquid containing the coating substance. For instance, plasma coating allows very thin coating layers, it allows coating of objects having all types of shapes, there are few losses of the coating substance, etc.

Plasma coating techniques can typically be divided in vacuum techniques and atmospheric techniques. The present invention relates to atmospheric plasma coating, wherein the pressure of the plasma is near atmospheric pressure. In practice, the plasma pressure can be slightly different from atmospheric pressure, e.g. a slight overpressure. Atmospheric plasma coating techniques have a major advantage over vacuum plasma coating techniques, because no vacuum chamber is required, and the coating process can easily be performed in-line.

A number of plasma coating processes have been disclosed in patent documents EP 0 217 399 A2, U.S. Pat. No. 3,914,573 A, US 2017/095929 A1 and EP 1 875 785 A1. These documents relate to particular types of plasma spray guns which heat up the plasma up to 1000° C. or more, and spray the plasma at high velocity to the substrate. A process such as disclosed in U.S. Pat. No. 3,914,573 A can typically be used to coat metal objects such as steel, having melting temperature well above the plasma temperature, with material particles. The high plasma temperature is required to soften the material particles for enhanced coating unto the substrate.

The present invention, however, relates to a different type of atmospheric plasma coating process and apparatus therefor, which allows coating of molecular substances to all types of substrates, including metallic and non-metallic substrates, in particular also plastic and/or glass substances having melting temperatures and/or flow temperatures well below 1000° C., and sometimes even below 200° C., 150° C., 100° C. or even less. Clearly, the processes and dedicated equipment of the plasma spray guns disclosed in EP 0 217 399 A2, U.S. Pat. No. 3,914,573 A, US 2017/095929 A1 and EP 1 875 785 A1, cannot be used. A plasma coating technique at low temperature, typically a plasma temperature of below 200° C., is required.

JP 2008/130 503 A discloses a device comprising an atmospheric pressure plasma jet generating means and a processing chamber. A plasma jet can be inserted into the processing chamber. The processing chamber comprises an upper part of resin and a lower part, mutually spaced by a small gap, whereby the device is configured to prevent inclusion of ambient air in the processing chamber via overpressure, which causes an outflow of gas from the processing chamber via the small gap.

The document discloses solving the problem of providing an atmospheric pressure plasma jet apparatus capable of lengthening the plasma plume to efficiently reform the surface irrespective of the surface shape of the material.

However, the device according to the document is not suitable for coating deposition. The document in particular describes cleaning and hydrophilicity improvement as possible uses.

In addition, the device according to the document is not suitable for in-line processing of continuous substrates. The document in particular describes opening area adjustment means (or shutters) for loading and unloading of a processing object. The document furthermore describes that the size of the processing object is substantially equal to the opening surface of the upper part of the processing chamber. The document thereby provides for a batch processing chamber.

Furthermore, the device according to the document is not adapted for easy cleaning, long-term maintenance and/or in-line treatment of a plurality of irregular surfaces.

JP 2007/323 812 A discloses an atmospheric pressure plasma device comprising a first reaction space and a mixing gas container comprising a mixing gas region. The device is configured to insert a primary plasma jet from the first reaction space into the mixing gas region and to insert a mixed gas comprising a reactive gas into the mixing gas region to collide with the primary plasma.

The device according to the document is not adapted for in-line plasma deposition on a continuous substrate with an irregular surface. The device is furthermore not adapted for easy cleaning and/or long-term maintenance.

The present invention aims to resolve at least some of the problems mentioned above. It thereby aims to allow in-line atmospheric plasma coating at low temperature of all types of substrates to obtain a homogeneous coating.

SUMMARY OF THE INVENTION

The present invention provides for a method for depositing a coating via an atmospheric pressure plasma jet, the method comprising the steps of:

providing an atmospheric pressure plasma jet generator (1) comprising a jet outlet (12);

providing a shield (2) comprising a jet inlet (22), a nozzle outlet (24) and a sidewall (21) extending from the jet inlet to the nozzle outlet;

detachably attaching the shield to the plasma jet generator and thereby communicatively coupling the jet inlet and the jet outlet;

providing a plasma jet in the shield via the plasma jet generator and injecting coating precursors in the plasma jet in the shield, thereby creating an overpressure in the shield with respect to the environment; and relatively moving a surface of a substrate and the nozzle outlet and thereby depositing a coating on said surface.

The nozzle outlet of the shield can be placed in close proximity with a surface of a substrate to be treated, and via overpressure in the shield, substantial inflow of ambient air can be prevented. During coating deposition, the shield may deteriorate, for example due to the plasma jet deteriorating the shield inner wall and/or deposition of a coating on the shield inner wall. In addition, and more importantly, when substrates of different size and/or shape are utilized, a single nozzle may not yield satisfactory results for each substrate. The present invention allows to replace the shield depending on the application. For in-line coating deposition on large planar surfaces, a shield with a large planar nozzle outlet may be utilized. For in-line coating deposition on non-planar surfaces, a shield with a particularly adapted non-planar nozzle may be utilized. For treatment of a finite irregular specimen, the specimen may remain stationary and the jet may be moved, whereby the nozzle outlet may comprise a size sufficiently small to allow for closely following the surface of the specimen. The present invention allows in-line plasma coating of all types of objects with a low-temperature, oxygen-free plasma at an operating pressure which is slightly higher than the atmospheric pressure, preferably by at most 10%, by providing a plasma jet in the shield via the plasma jet generator and injecting coating precursors in the plasma jet in the shield, thereby creating said operating pressure. The overpressure, in combination with the small gap between edge of the nozzle outlet and the object's surface, due to the congruency of the nozzle outlet edge with the object's profile, allows to subject the object's surface to an oxygen-depleted plasma zone, which in turn leads to better results for the coating, in particular in terms of homogeneity and stability, which includes a better adhesion of the coating to the surface and less degradation in time. Furthermore, the presence of a oxygen-depleted plasma zone allows to use a large number of precursor molecules which could otherwise not have been used due to their reactivity with oxygen.

It should further be noted that the plasma temperature is preferably kept low in the present invention, preferably lower than 200° C., more preferably lower than 180° C., more preferably lower than 160° C., more preferably lower than 140° C., more preferably lower than 130° C., more preferably lower than 120° C., more preferably lower than 110° C., more preferably lower than 100° C., more preferably lower than 90° C., more preferably lower than 80° C., more preferably lower than 70° C., more preferably lower than 60° C., more preferably lower than 50° C.

Further advantages, features, and examples of the present invention are disclosed in the detailed description.

DETAILED DESCRIPTION OF THE INVENTION

The present invention concerns an apparatus and a method for depositing a coating via an atmospheric pressure plasma jet. The present invention furthermore concerns a kit. The invention has been summarized in the corresponding section above. In what follows, the invention is described in detail, preferred embodiments are discussed, and the invention is illustrated via examples.

Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

As used herein, the following terms have the following meanings:

"A", "an", and "the" as used herein refers to both singular and plural referents unless the context clearly dictates otherwise. By way of example, "a compartment" refers to one or more than one compartment.

"About" as used herein referring to a measurable value such as a parameter, an amount, a temporal duration, and the like, is meant to encompass variations of +/−20% or less, preferably +/−10% or less, more preferably +/−5% or less, even more preferably +/−1% or less, and still more preferably +/−0.1% or less of and from the specified value, in so far such variations are appropriate to perform in the disclosed invention. However, it is to be understood that the value to which the modifier "about" refers is itself also specifically disclosed.

"Comprise", "comprising", and "comprises" and "comprised of" as used herein are synonymous with "include", "including", "includes" or "contain", "containing", "contains" and are inclusive or open-ended terms that specify the presence of what follows e.g. component and do not exclude or preclude the presence of additional, non-recited components, features, elements, members, steps, known in the art or disclosed therein.

The recitation of numerical ranges by endpoints includes all numbers and fractions subsumed within that range, as well as the recited endpoints.

In a first aspect, the invention provides for a method for depositing a coating via an atmospheric pressure plasma jet, comprising several steps. A plasma jet generator comprising a jet outlet is provided. A shield is manufactured, with an edge congruent to the profile of the object to be treated. The shield comprises a jet inlet, a nozzle outlet and a sidewall extending from the jet inlet to the nozzle outlet. The shield may be detachably attached to the plasma jet generator, whereby the jet inlet and the jet outlet are communicatively coupled. A plasma jet may be provided in the shield via the plasma jet generator. Coating precursors may be injected in the plasma jet in the shield. Thereby, an overpressure may be created in the shield with respect to the environment. A surface of a substrate may be moved relatively with respect to the nozzle outlet and a coating may thereby be deposited on the surface.

In a second aspect, the invention provides for a kit. The kit may be configured for an atmospheric pressure plasma jet generator comprising a jet outlet. The nozzle kit may comprise an adaptor and a plurality of replaceable shields. Each shield comprises a jet inlet, a nozzle outlet and a sidewall extending from the jet inlet to the nozzle outlet. The adaptor may be configured for detachably attaching one of said shields onto the plasma jet generator and thereby communicatively coupling the jet outlet and the jet inlet.

In a third aspect, the invention provides for an apparatus for depositing a coating via an atmospheric pressure plasma jet. The apparatus comprises a plasma jet generator comprising a jet outlet. The apparatus furthermore comprises an adaptor and a replaceable shield. The shield comprises a jet inlet, a nozzle outlet and a sidewall extending from the jet inlet to the nozzle outlet. The adaptor is configured for detachably attaching the shield onto the plasma jet generator, and thereby communicatively coupling the jet outlet and the jet inlet.

The nozzle kit according to the second aspect may be used for an apparatus according to the third aspect and/or in a method according to the first aspect. The method according to the first aspect may be executed via an apparatus according to the third aspect. One of ordinary skill in the art will appreciate that the three aspects of the present invention are hence interrelated. Therefore, each feature disclosed in this document, above or below, may pertain to each of the aspects of the present invention, even if it has been disclosed in conjunction to a particular aspect.

"Atmospheric pressure" as used herein denotes that the pressure approximately or about matches that of the surrounding environment. The term distinguishes the present plasma technology with low- and high-pressure plasma technologies which require a reaction vessel to maintain a substantial pressure difference with the environment. One of ordinary skill in plasma technology will therefore appreciate that "atmospheric pressure" as used herein should not be interpreted as the pressure unit "atm" defined as 101 325 Pa.

"Communicatively coupled" as used herein refers to mass flow, i.e. fluid, gas and/or plasma flow. A communicatively coupled jet outlet of a plasma jet generator and jet inlet of a shield are therefore configured for a plasma jet exiting said jet outlet to enter the shield via jet inlet.

"Plasma jet" as used herein refers to a plasma jet and/or an afterglow of the plasma jet. For example, coating precursors injected into the "plasma jet" inside the shield may refer to coating precursors injected into the plasma jet and/or an afterglow of the plasma jet inside the shield.

The method of the present invention comprises the following steps:
a. manufacturing a replaceable shield (2) comprising a jet inlet (22), a nozzle outlet (24) and a sidewall (21) extending from the jet inlet to the nozzle outlet, wherein the nozzle outlet comprises an edge (25) essentially congruent to at least part of the object profile;
b. detachably attaching the replaceable shield to a jet outlet of a plasma jet generator;
c. placing the object at the nozzle outlet such that the object profile fits closely to the nozzle outlet edge, thereby minimizing a gap between the nozzle outlet and the object;
d. plasma coating the object with a low-temperature, oxygen-free plasma at an operating pressure which is higher than the atmospheric pressure, preferably by at most 10%, by providing a plasma jet in the shield via the plasma jet generator and injecting coating precursors in the plasma jet in the shield, thereby creating said operating pressure, thereby plasma coating the object in an oxygen-depleted plasma zone.

In step a, the replaceable field is particularly manufactured to have an edge which is congruent to at least part of the object profile. Hence, if objects of different types are to be coated, different shields can be manufactured, each of which having a congruent edge for the respective type of object. The method can thus also be applied for plasma coating multiple types of objects, each type of object comprising a different object profile, wherein step a is performed for each type of object, whereby multiple replaceable shields are manufactured, each shield comprising a nozzle outlet with nozzle outlet edge essentially congruent to at least part of the object profile of the respective object. In a preferred embodiment, the shield is manufactured using a 3D printing technique, which allows to make very intricate edges in a reasonably fast and reliable manner.

The method is particularly related to low-temperature plasma. Hereby, preferably, the plasma temperature is lower than 120° C., more preferably lower than 70° C.

The kit of the present invention comprises a plurality of replaceable shields (2), each shield comprising a jet inlet (22), a nozzle outlet (24) and a sidewall (21) extending from the jet inlet to the nozzle outlet, wherein the nozzle outlet of each shield comprises a nozzle outlet edge essentially congruent to at least part of an object profile of an object, preferably each shield comprising a nozzle outlet with nozzle outlet edge essentially congruent with a respective part of an object profile or with at least part of respective object profiles of multiple types of objects.

In order to allow easy detachment of a first shield and easy attachment of a second shield, preferably the shield is detachably attached to the jet outlet by an adaptor (3) configured for detachably attaching the shield onto the plasma jet generator and thereby communicatively coupling the jet outlet of the plasma jet generator and the jet inlet of the shield.

During step d, the object can be moved relatively with respect to the nozzle outlet and edge, for instance to perform in-line coating. Hereby, said edge is preferably maintained at a distance of at least 0.1 mm and at most 5 mm, preferably at least 0.2 mm and at most 2 mm, more preferably at least 0.5 mm and at most 1 mm, of said surface of said substrate.

In a preferred embodiment, the object profile is essentially the same along a longitudinal direction and said relative movement comprises a relative translation along said longitudinal direction. This is particularly the case for plate-like or sheet-like objects which may be non-planar, i.e. have a non-straight cross section perpendicular to the longitudinal direction.

In a preferred embodiment, the edge is a first edge which is circumferentially congruent to the object profile, and whereby said shield comprises a second edge which is an object inlet edge which is circumferentially congruent to the object profile, and whereby said relative movement comprises movement of the object in the longitudinal direction from the object inlet edge to the first edge through a treatment chamber within said shield. This is particularly useful if the object is a fiber with a profile comprising an essentially circular cross section which is the same in a longitudinal direction, preferably whereby a method according to claim 9 is used, wherein the first edge and the second edge comprise a circular opening having a diameter congruent to the cross section of the fiber, thereby allowing passage of the fiber through the openings of said first and second edges. This is also particularly useful if the object is a powder which is blown along a longitudinal directional, thereby forming a powder beam having a profile comprising an essentially circular cross section with a diameter which is the same in a longitudinal direction or which varies in the longitudinal direction, preferably whereby a method according to claim 9 is used, wherein the first edge and the second edge comprise a respective circular opening having respective diameters congruent to the cross section of the powder beam at the position of the first edge and the second edge respectively, thereby allowing passage of the powder through the openings of said first and second edges.

In another preferred embodiment, the object profile is essentially axially symmetric around a central axis and said relative movement comprises a relative rotation around said central axis. Hereby, the surface of the object can be treated in a fast and reliable manner by rotating the object or the shield, or both, around the central axis, e.g. for 360° or an integer times 360° for multiple coating passes.

The kit preferably also comprises a plasma jet generator to which each of the plurality of shields can be attached. The kit may comprise one plasma jet generator or more than one plasma jet generator, e.g. 2, 3, 4 or more.

The apparatus of the present invention comprises:
a plasma jet generator (1) comprising a jet outlet (12); and
a nozzle comprising an adaptor (3) and a replaceable shield (2), the shield comprising a jet inlet (22), a nozzle outlet (24) and a sidewall (21) extending from the jet inlet to the nozzle outlet,
wherein the adaptor is configured for detachably attaching the shield onto the plasma jet generator and thereby communicatively coupling the jet outlet and the jet inlet.

The nozzle outlet of the shield can be placed in close proximity with a surface of a substrate to be treated, and via overpressure inside the shield, substantial inflow of ambient air can be prevented. During coating deposition, the shield may deteriorate and/or be polluted, for example due to the plasma jet deteriorating the shield inner wall and/or coating deposition on the shield inner wall. In addition, when substrates of different size and/or shape are utilized, a single nozzle may not yield satisfactory results for each substrate. The present invention allows to replace the shield depending on the application. For in-line coating deposition on large planar surfaces, a shield with a large planar nozzle outlet and large precursor throughput may be utilized. For in-line coating deposition on non-planar surfaces, a shield with a particularly adapted non-planar nozzle outlet may be utilized. For treatment of a finite irregular specimen, the specimen may remain stationary and the plasma jet generator may be moved, whereby the nozzle outlet may comprise a size sufficiently small to allow for closely following the surface of the irregular specimen. When a first coating precursor used in a first coating deposition on a first substrate is undesired in a second coating deposition on a second substrate, the nozzle may be replaced to avoid contamination with the first coating precursor during the second coating deposition.

In a preferred embodiment, the shield comprises at the jet inlet a flange attached to the sidewall. The adaptor may comprise a retaining wall comprising an opening with size and shape adapted for retaining the flange. The adaptor and the plasma jet generator may comprise complementary attachment means configured for attaching the adaptor to the plasma jet generator. The adaptor may be configured to press via the retaining wall the flange of the shield against the plasma jet generator in a position whereby the jet outlet and the jet inlet are communicatively coupled. Preferably, the flange comprises a planar surface which circumferences the jet inlet. Preferably, the flange is adapted for being pressed by the adaptor against the plasma jet generator in a way to avoid substantial inflow of ambient air into the shield via the jet inlet. The flange thereby comprises the dual purpose of avoiding substantial inflow of ambient air into the shield via the jet inlet and attachment of the shield onto the jet generator via the adaptor. The shield comprises a length direction, along which the jet inlet and the nozzle outlet are spatially separated. Preferably, the flange is in essence perpendicular to said length direction. Preferably, said planar surface of said flange is in essence perpendicular to said length direction.

Preferably, the shield is monolithic. A shield may be manufactured via injection molding. A shield may be manufactured via 3D printing. Preferably, a shield comprises an insulating material, more preferably a plastic. The nozzle outlet of the shield comprises an edge. The nozzle outlet of a shield may comprise a planar edge, i.e. the nozzle outlet is planar. The nozzle outlet of a shield may comprise a non-planar edge, i.e. the nozzle outlet is non-planar. This allows for in-line coating of non-planar surfaces, whereby a small distance is maintained between each portion of the edge and the surface.

Coating precursors may be injected into the plasma jet in the shield. The jet outlet of the plasma jet generator may comprise multiple outlet compartments. The plasma jet generator may be configured for providing a plasma jet from a first compartment and coating precursors from a second compartment. The jet outlet may comprise two concentric cylindrical walls, defining an inner compartment for providing coating precursors and an outer compartment for providing a plasma jet. The jet outlet may comprise a rectangular outlet sectioned into three compartments via two inner walls, defining an intermediate compartment for providing coating precursors and two outer compartments for providing a plasma jet.

In a preferred embodiment, the sidewall of the shield comprises at least one precursor inlet, preferably at least two precursor inlets, such as two, three, four or more precursor inlets. A precursor inlet may comprise a tubular hollow body comprising a first outer end communicatively coupled with the inside of the shield and a second outer end for communicative coupling with a precursor source. The tubular body may by cylindrical. The tubular body may comprise one or more bends. The coating precursors may be injected via said at least one precursor inlet in the plasma jet in the shield.

In a preferred embodiment, the jet outlet of the plasma jet generator comprises an opening and the jet inlet of the shield comprises an opening, whereby the opening of the jet inlet is larger than the opening of the jet outlet. This is advantageous as an enlargement results in a decrease in velocity and in a pressure rise, thereby aiding in creating the overpressure inside the shield with respect to the environment. This is further advantageous as a sharp enlargement may cause turbulent flow and/or recirculation and therefore mixing of the components present in a corresponding portion of the shield. Preferably, the shield comprises a length in between the jet inlet and the nozzle outlet, and said at least one precursor inlet is communicatively coupled with the inside of the shield within a distance of the jet inlet equal to at most 50% of said length, preferably at most 40% of said length, more preferably at most 30% of said length. This is advantageous as the inflow of precursors occurs in a region where the recirculation also occurs. This is further advantageous as the inflow of precursors occurs in a direction substantially non-parallel with, preferably in essence perpendicular to, the plasma jet inflow at the jet inlet, preferably in essence parallel to the length direction, thereby further augmenting the turbulent flow.

In a preferred embodiment, the sidewall of the shield comprises a tapering portion. The tapering portion may enlarge a cross section of the shield from the jet inlet towards the jet outlet, e.g. for depositing a coating on a large in essence planar surface. The tapering portion may shrink a cross section of the shield from the jet inlet towards the jet outlet, e.g. for focusing the coating deposition on a narrow spot, thereby optionally creating a small nozzle outlet for enabling closely following an irregular surface via movement of the nozzle outlet. Preferably, the tapering portion is adapted for the nozzle outlet to comprise a smaller opening than the jet inlet. Preferably, the tapering portion extends over at least 20% of the length of the shield.

In a preferred embodiment, the nozzle comprises a homogenization means. Preferably, the shield comprises said homogenization means, preferably on the inside. The homogenization means may comprise flow disturbance elements. The flow disturbance elements may comprise a plurality of inclined surfaces. The flow disturbance elements may comprise a plurality of layers each comprising a multitude of inclined surfaces. A flow disturbance element may comprise a surface comprising an angle of at least 20° and at most 70° with the length direction of the shield.

In a preferred embodiment, the nozzle is adapted for cooling. Preferably, the sidewall of the shield comprises a channel for passage of a cooling fluid. The channel is preferably located at a distance from the nozzle outlet of at most 60%, more preferably at most 50%, even more preferably at most 45%, of the length of the shield.

In a preferred embodiment, the apparatus may comprise a transport means for in-line treatment of a planar or non-planar surface of a continuous substrate, whereby the apparatus is configured for maintaining each portion of the edge of the nozzle outlet at a distance of at least 0.1 mm and at most 5 mm, preferably at least 0.2 mm and at most 2 mm, more preferably at least 0.5 mm and at most 1 mm, of said surface of said substrate. The method may comprise the step of relatively moving a surface of a substrate and the nozzle outlet, whereby each portion of said edge is maintained as a distance of at least 0.1 mm and at most 5 mm, preferably at least 0.2 mm and most 2 mm, more preferably at least 0.5 mm and at most 1 mm, of said surface of said substrate and thereby depositing a coating on said surface. A gap of the stated magnitude in between the edge of the nozzle outlet and the surface of the substrate is particularly well-suited for preventing inflow of ambient air via a slight overpressure in the shield, while at the same time allowing sufficient outflow of the gasses from the shield.

In a preferred embodiment, the plasma jet generator is configured to generate a plasma jet via a dielectric barrier discharge or a corona discharge. Preferably, the plasma jet generator comprises an AC power source.

The invention is further described by the following non-limiting examples which further illustrate the invention, and are not intended to, nor should they be interpreted to, limit the scope of the invention.

EXAMPLES

Example 1: First Apparatus

Figure 1A:
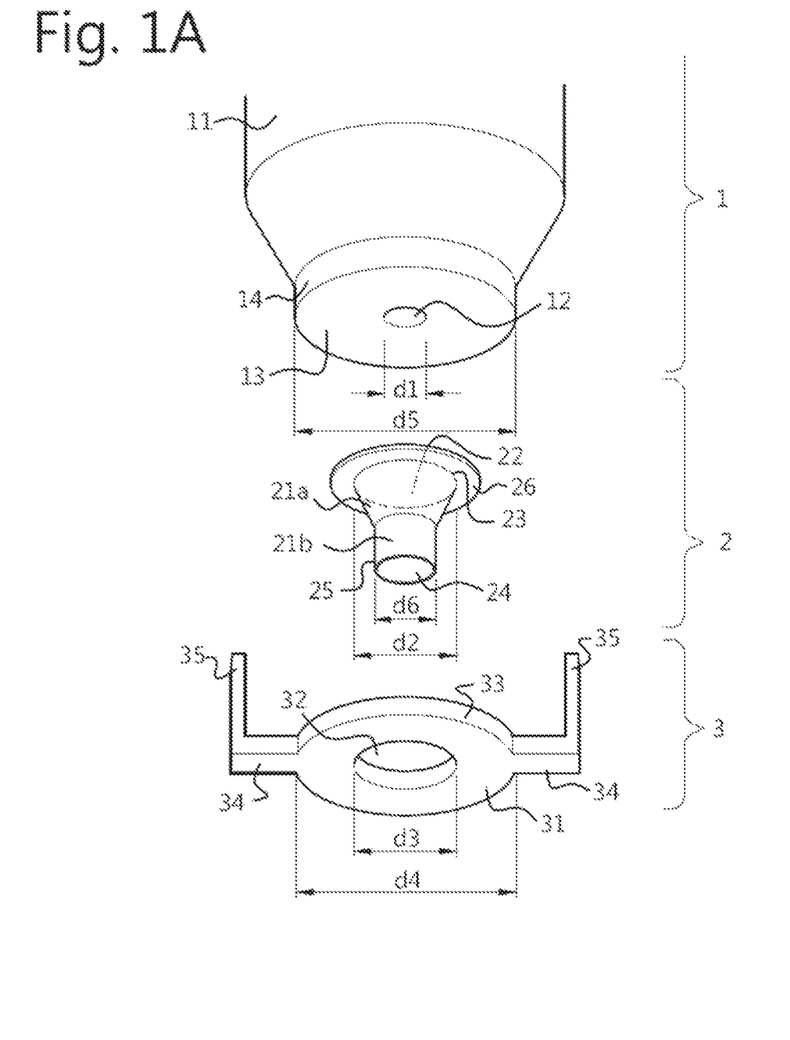
FIGS. 1a and 1b show perspective views of embodiments of apparatuses according to the present invention.

At least a part of a first embodiment of an apparatus according to the present invention is shown in FIG. 1a. The apparatus comprises an atmospheric pressure plasma jet generator (1) and a nozzle comprising an adaptor (3) and a shield (2).

The plasma jet generator (1) comprises a main body (11) comprising a cylindrical outer end. The cylindrical outer end comprises a sidewall (14) and an end wall (13) in essence perpendicular to the sidewall wherein a jet outlet (12) is provided. The cylindrical outer end comprises a diameter (d5). The jet outlet (12) comprises a diameter (d1). The plasma jet generator (1) comprises two cylindrical walls defining two compartments in the jet outlet (12): an inner compartment for providing coating precursors and an outer compartment for providing a plasma jet and/or afterglow. The plasma jet generator may exemplary be configured according to claims 1 to 8 of EP 1 844 635 B1 and the corresponding sections of the description.

The shield (2) comprises a jet inlet (22), a nozzle outlet (24) and a sidewall (21a, 21b) extending from the jet inlet (22) to the nozzle outlet (24). The shield comprises a length direction along which the jet inlet (22) and the nozzle outlet (24) are spaced. The shield (2) comprises a flange (26) at the jet inlet which is attached at the edge (23) of the jet inlet (22) to the sidewall (21a) and which circumferences the jet inlet (22). The jet inlet comprises a diameter (d2). The nozzle outlet comprises a diameter (d6). The shield comprises a tapering portion (21a) located within a distance of the jet inlet equal to at most 50% of the length of the shield according to the length direction. The tapering portion (21a) narrows the shield from the jet inlet towards the nozzle outlet, due to which the nozzle outlet diameter (d6) is smaller than the jet inlet diameter (d2). The jet inlet diameter (d2) is larger than the jet outlet diameter (d3), enabling the advantageous consequences described in the detailed description. The nozzle outlet comprises a planar edge (25), i.e. the edge of the nozzle outlet lies in essence in a plane. Preferably, the plane is in essence perpendicular to the length direction.

The adaptor (3) comprises a retaining wall (31) comprising a circular opening (32) comprising a diameter (d3) in essence equal to or slightly larger than the jet inlet diameter (d2) plus twice the sidewall (21a) thickness. The opening (32) thereby comprises a size and shape configured for retaining the flange (26) of the shield (2), and in particular for pressing the flange (26) onto the end wall (13) of the plasma jet generator (1). The retaining wall comprises a diameter (d4) in essence equal to the outer end diameter (d5). The adaptor furthermore comprises two curved sidewall portions (33) for positioning over the sidewall (14) of the outer end of the plasma jet generator and two arms (34) comprising attachment means (35) for attaching the adaptor to the plasma jet generator and thereby pressing the flange (26) against the end wall (13) while maintaining the jet outlet (12) and the jet inlet (22) communicatively coupled. The attachment means may comprise holes for attaching an elastic tensioning mechanism.

Example 2: Apparatus

Figure 1B:
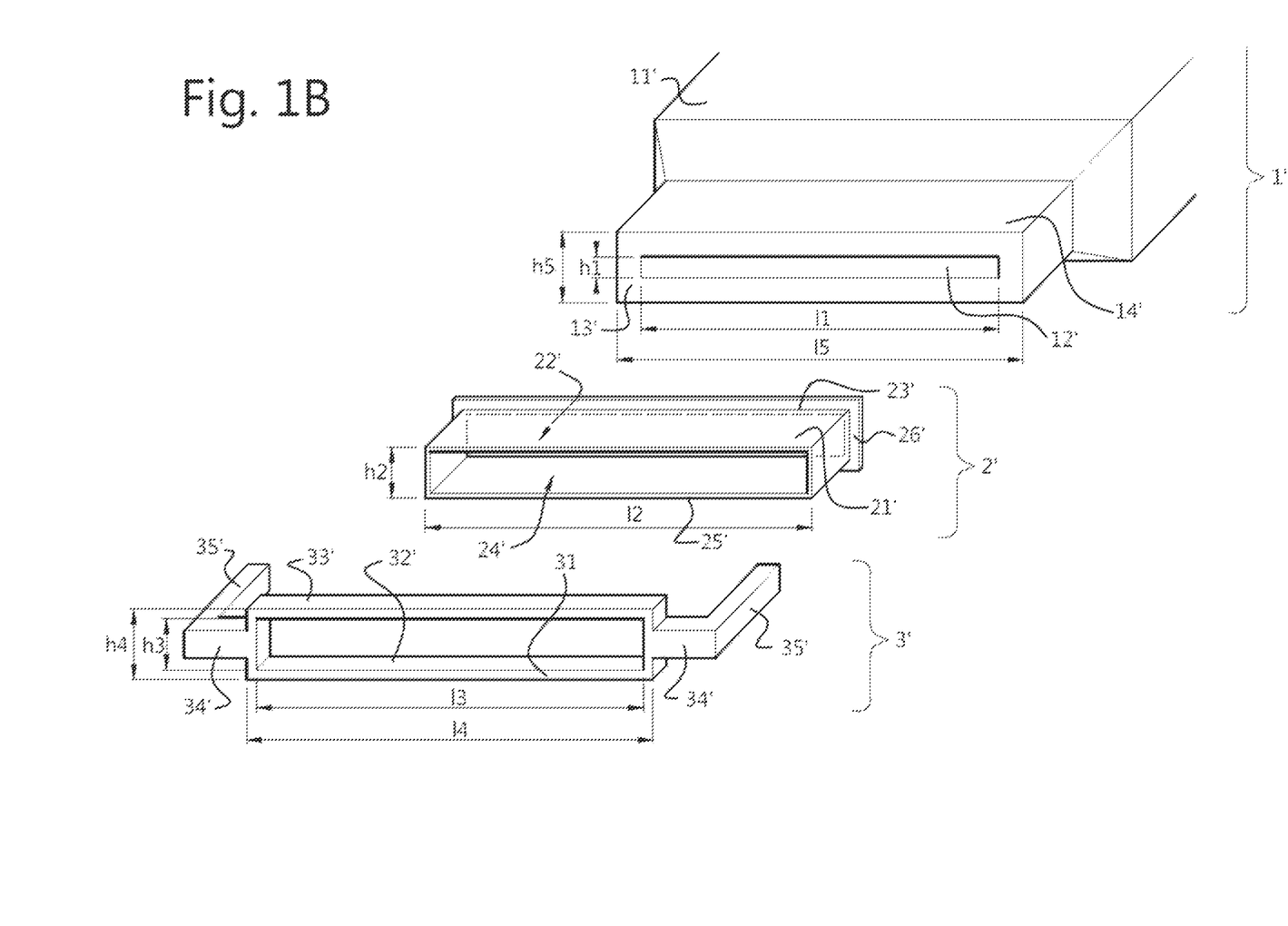

At least a part of a second embodiment of an apparatus according to the present invention is shown in FIG. 1b. The apparatus comprises an atmospheric pressure plasma jet generator (1') and a nozzle comprising an adaptor (3') and a shield (2').

The plasma jet generator (1') comprises a main body (11') comprising a cuboid outer end. The cuboid outer end comprises a sidewall (14') and an end wall (13') in essence perpendicular to the sidewall and wherein a jet outlet (12') is provided. The cuboid outer end comprises a height (h5) and a width (15). The jet outlet (12') comprises a height (h1) and a width (11). The plasma jet generator (1') comprises two inner walls defining three compartments in the jet outlet (12'): an inner compartment for providing coating precursors and two outer compartments for providing a plasma jet and/or afterglow. The plasma jet generator may exemplary be configured according to claims 9 to 15 of EP 1 844 635 B1 and the corresponding sections of the description.

The shield (2') comprises a jet inlet (22'), a nozzle outlet (24') and a sidewall (21') extending from the jet inlet (22') to the nozzle outlet (24'). The shield comprises a length direction along which the jet inlet (22') and the nozzle outlet (24') are spaced. The sidewall comprises a uniform rectangular cross section in essence perpendicular to the length direction. The shield (2') comprises a flange (26') at the jet inlet which is attached at the edge (23') of the jet inlet (22') to the sidewall (21') and which circumferences the jet inlet (22'). The jet inlet and nozzle outlet comprise a height (h2) and a width (12). The nozzle outlet (24') comprises a planar edge (25'), i.e. the edge of the nozzle outlet lies in essence in a plane. Preferably, the plane is in essence perpendicular to the length direction.

The adaptor (3') comprises a retaining wall (31') comprising a rectangular opening (32') comprising a height (h3) and width (13) in essence equal to or slightly larger than respectively the jet inlet height (h2) and width (12) plus twice the sidewall (21') thickness. The opening (32') thereby comprises a size and shape configured for retaining the flange (26') of the shield (2'), and in particular for pressing the flange (26') onto the end wall (13') of the plasma jet generator (1'). The retaining wall comprises a height (h4) and width (14) in essence equal to respectively the outer end height (h5) and width (15). The adaptor furthermore comprises two sidewall portions (33') for positioning over the sidewall (14') of the outer end of the plasma jet generator and two arms (34') comprising attachment means (35') for attaching the adaptor to the plasma jet generator and thereby pressing the flange (26') against the end wall (13') while maintaining the jet outlet (12') and the jet inlet (22') communicatively coupled. The attachment means may comprise holes for attaching an elastic tensioning mechanism.

Example 3 Shield Shapes

In this example, reference is made with respect to FIGS. 2a, 2b, 2c and 2d. The specific features disclosed in this example may pertain to the shields of examples 1 and 2 above.

Figure 2A:
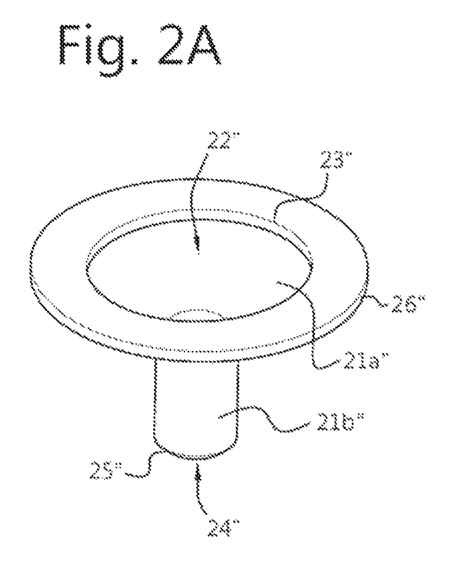
FIGS. 2a, 2b, 2c, 2d and 3 show perspective views of embodiments of shields according to the present invention.
Figure 2B:
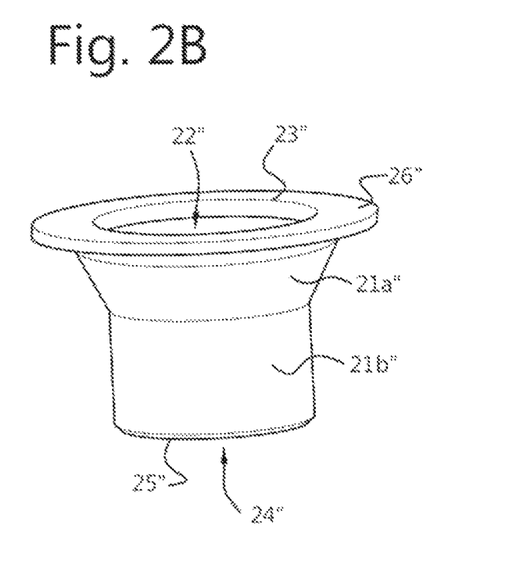
Figure 2C:
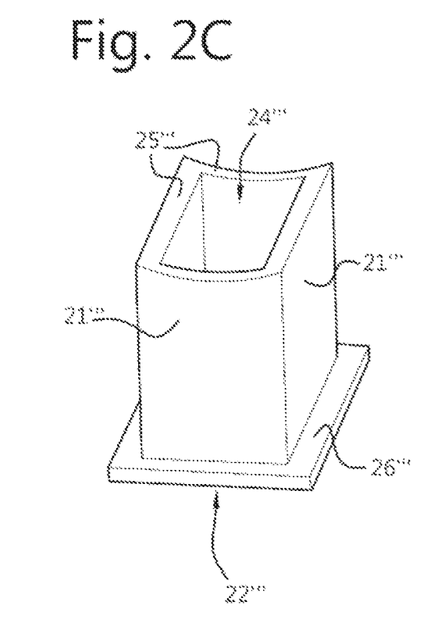
Figure 2D:
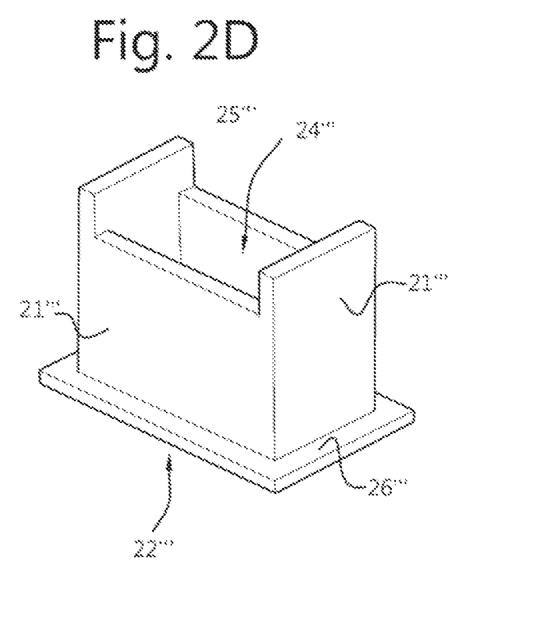

A shield comprises a jet inlet (22", 22''') and a nozzle outlet (24", 24'''). The shield furthermore comprises a length direction along which the jet inlet and the nozzle outlet are spatially separated. The shield also comprises a sidewall (21a", 21b", 21''') extending from the jet inlet to the nozzle outlet. The shield comprises a length along the length direction, i.e. a distance over which the jet inlet and the nozzle outlet are spaced. The jet inlet comprises an in essence planar edge (23") in essence perpendicular to the length direction. The shield furthermore comprises a flange (26", 26''') at the jet inlet and attached to the sidewall, which circumferences the jet inlet. The sidewall of the shield may comprise a uniform cross section perpendicular to the length direction (FIGS. 2c and 2d). The sidewall of the shield may alternatively comprise a tapering portion (21a") and a portion (21b") with uniform cross section perpendicular to the length direction. The sidewall of the shield may comprise a cross section perpendicular to the length direction which is circular (FIGS. 2a and 2b), oval, rectangular (FIGS. 2c and 2d), square, triangular, pentagonal, hexagonal, diamond-shaped, octagonal, star-shaped, cross-shaped, and the like. Preferably, the sidewall of the shield comprises a cross section perpendicular to the length direction comprising a shape adapted to the shape of the jet outlet and further comprising one or more dimensions larger than the corresponding dimensions of the jet outlet. Most preferably, said shape is circular or rectangular. The shield also comprises a nozzle outlet edge (25", 25''') at the nozzle outlet (24", 24'''). The nozzle outlet edge may be planar (FIGS. 2a and 2b). The nozzle outlet edge may lie within a plane perpendicular to the length direction. The nozzle outlet edge may also be non-planar (FIGS. 2c and 2d). The nozzle outlet edge may thereby comprise two portions comprising different distances to the flange. The nozzle outlet edge may thereby comprise portions comprising a curvature in the length direction.

Example 4: Additional Shield Features

Figure 3:
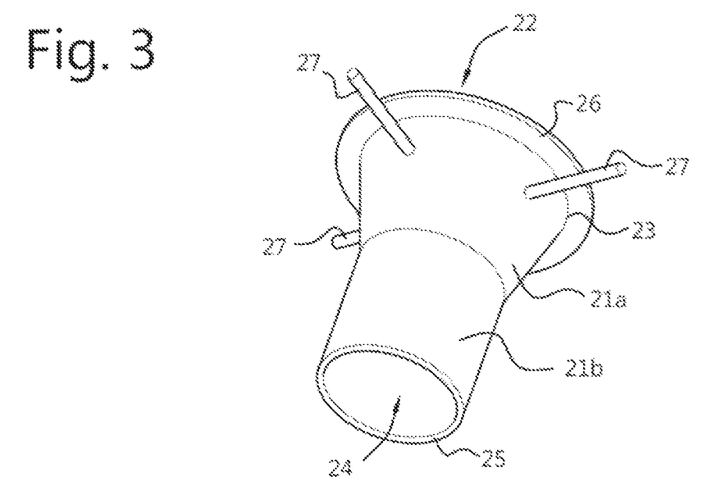

With reference to FIG. 3, a shield may comprise at least one, preferably at least two, precursor inlets (27). A precursor inlet is preferably communicatively coupled to the shield via the sidewall, more preferably within a distance of the jet inlet of at most 50% of the length of the shield. The precursor inlet may be coupled via a tapering portion (21a) of the sidewall (FIG. 3) or alternatively via a straight portion of the sidewall, i.e. a portion parallel to the length direction.

Figure 4:
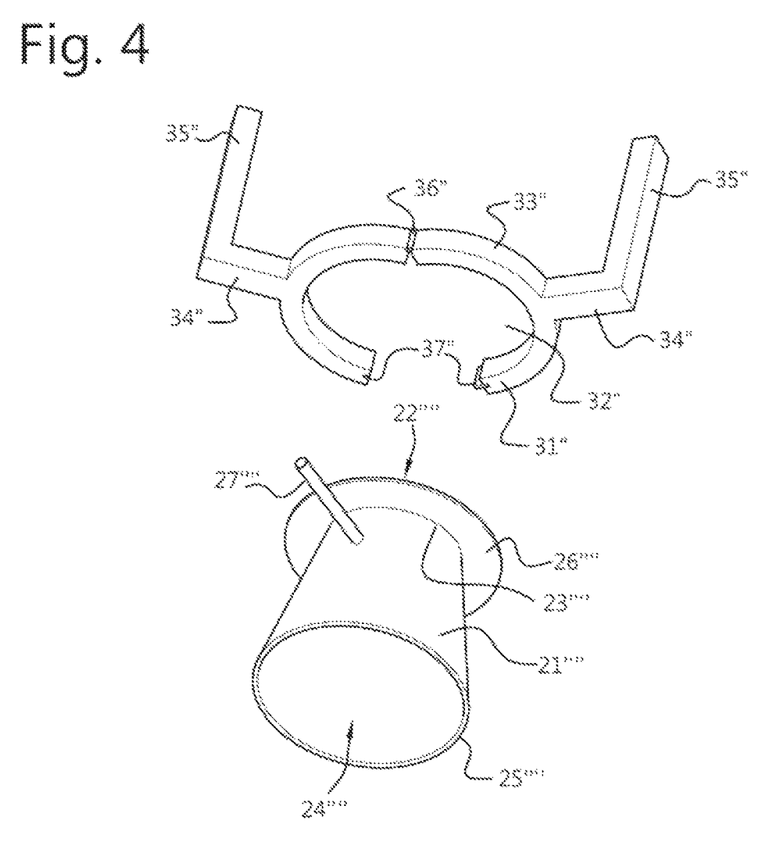
FIG. 4 shows a perspective view of an embodiment of an adaptor and a shield according to the present invention.

With reference to FIGS. 3 and 4, for protruding precursor inlets (27, 27'''') and/or shields comprising a tapering portion (21'''') widening the shield from the jet inlet (22'''') towards the nozzle outlet (24''''), the adaptor may comprise a hinge (36") and a locking mechanism (37") for enabling the surrounding of the flange (26") of the shield in order to press the flange (26'''') against an end wall of a plasma jet generator via the retaining wall (31") of the adaptor.

Figure 5A:
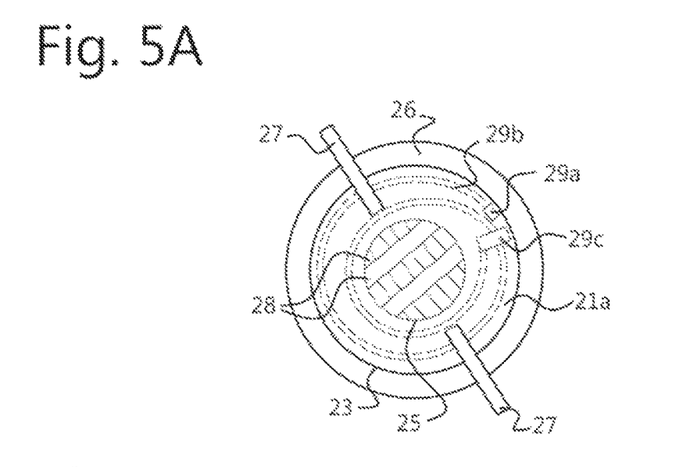
FIGS. 5a and 5b show, respectively, a longitudinal view and a side view of an embodiment of a shield according to the present invention.
Figure 5B:
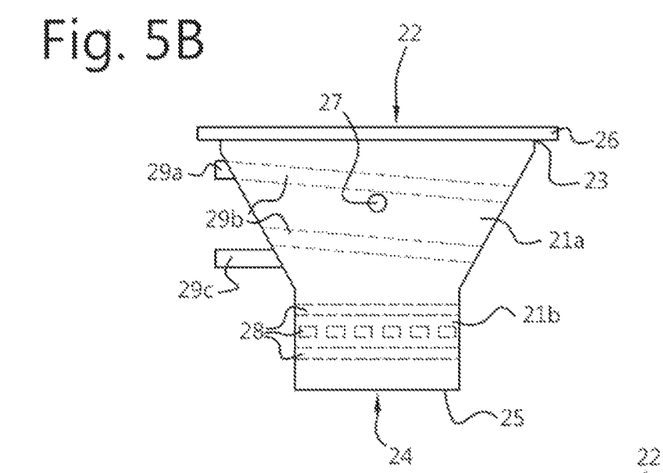
Figure 6:
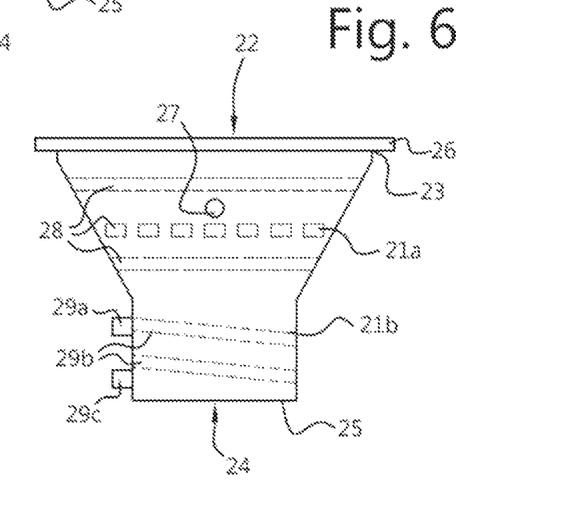
FIG. 6 shows a sideview of an alternative embodiment of a shield according to the present invention.

In FIGS. 5a, 5b and 6, a view along the length direction, a side view perpendicular to the length direction, and a side view perpendicular to the length direction of embodiments of shields according to the present invention are shown, respectively. The sidewall of the shield comprises a channel for passage of a cooling fluid. The channel comprises an inlet (29a), an outlet (29c), and a spiraling section (29b) within the sidewall extending from the channel inlet (29a) to the channel outlet (29c). The channel may be provided within a distance of the jet inlet equal to at most 50% of the length of the shield (FIGS. 5a and 5b). The channel may alternatively and preferentially be provided within a distance of the nozzle outlet equal to at most 50% of the length of the shield (FIG. 6). The shield furthermore comprises a plurality of layers of multiple flow disturbance elements (28). The layers are spaced in the length direction. Each element may comprise a surface at an angle of at least 20° and at most 70°, preferably at least 30° and at most 60°, with the length direction, thereby being configured for substantially diverting the direction of the flow, enabling mixing of components of the gasses and/or plasma and/or afterglow inside the shield. The plurality of layers may be provided within a distance of the nozzle outlet equal to at most 50% of the length of the shield (FIGS. 5a and 5b). The plurality of layers may alternatively and preferentially be provided within a distance of the jet inlet equal to at most 50% of the length of the shield (FIG. 6). The cooling mechanism and the homogenization means may hence be provided in a same portion of the shield or in a different portion of the shield.

Example 5: Powder Coating

Figure 7:
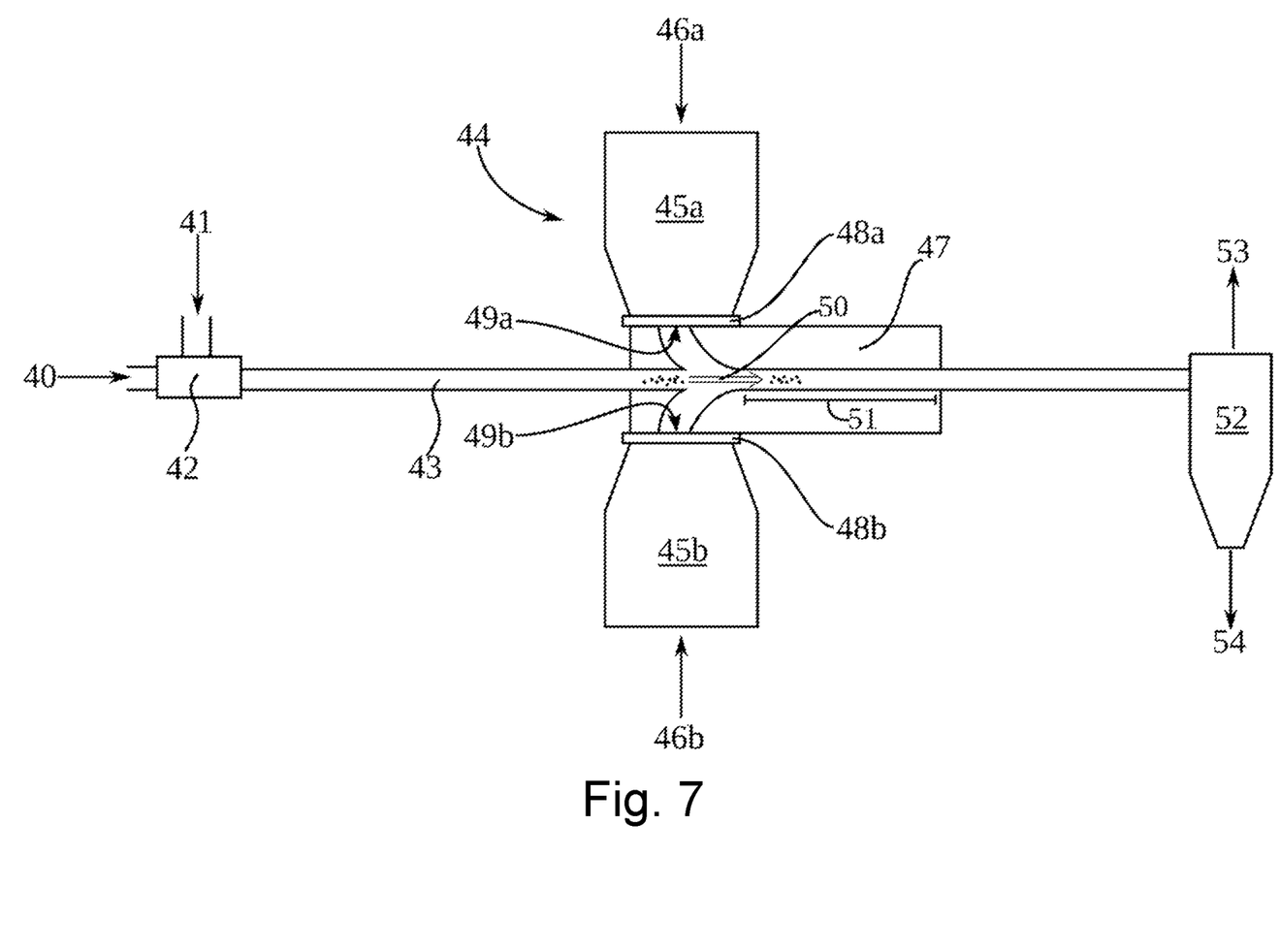
FIG. 7 illustrates a cross sectional view of an apparatus with a shield in accordance with the present invention, which is particularly preferred for plasma coating of powder.

FIG. 7 illustrates a cross sectional view of an apparatus with a shield in accordance with the present invention, which is particularly preferred for plasma coating of powder.

An inert gas can be provided at an inlet of a guiding system (40) at a predetermined flow. Powder (41) can be added, e.g. via a Venturi injector (42). The resulting powder beam is subsequently guided to a coating apparatus (44) with a first plasma jet generator (45a) and a second plasma jet generator (45b) to which an inert gas and an aerosol comprising the precursor are provided (46a, 46b). A shield (47) is detachably attached to the jet outlets of both plasma jet generators (45a, 45b) by two adaptors (48a, 48b), whereby the jet inlets (49a, 49b) of the shield are brought in communication with the jet outlets of the plasma jet generators. The powder beam flows along a longitudinal direction (50) from an object inlet edge which is circumferentially congruent to the powder beam through the plasma and continues to be exposed to the plasma for a certain length (51), allowing coating of the individual powder particles. The beam leaves the shield through an object outlet edge which is circumferentially congruent to the powder beam, and is then collected in a collector system (52), e.g. a cyclone, for extracting the coated powder (54) from the inert gas (53). The coated powder can be returned to the inlet (40) for further coating cycles.

Example 6: Fiber Coating

Figure 8:
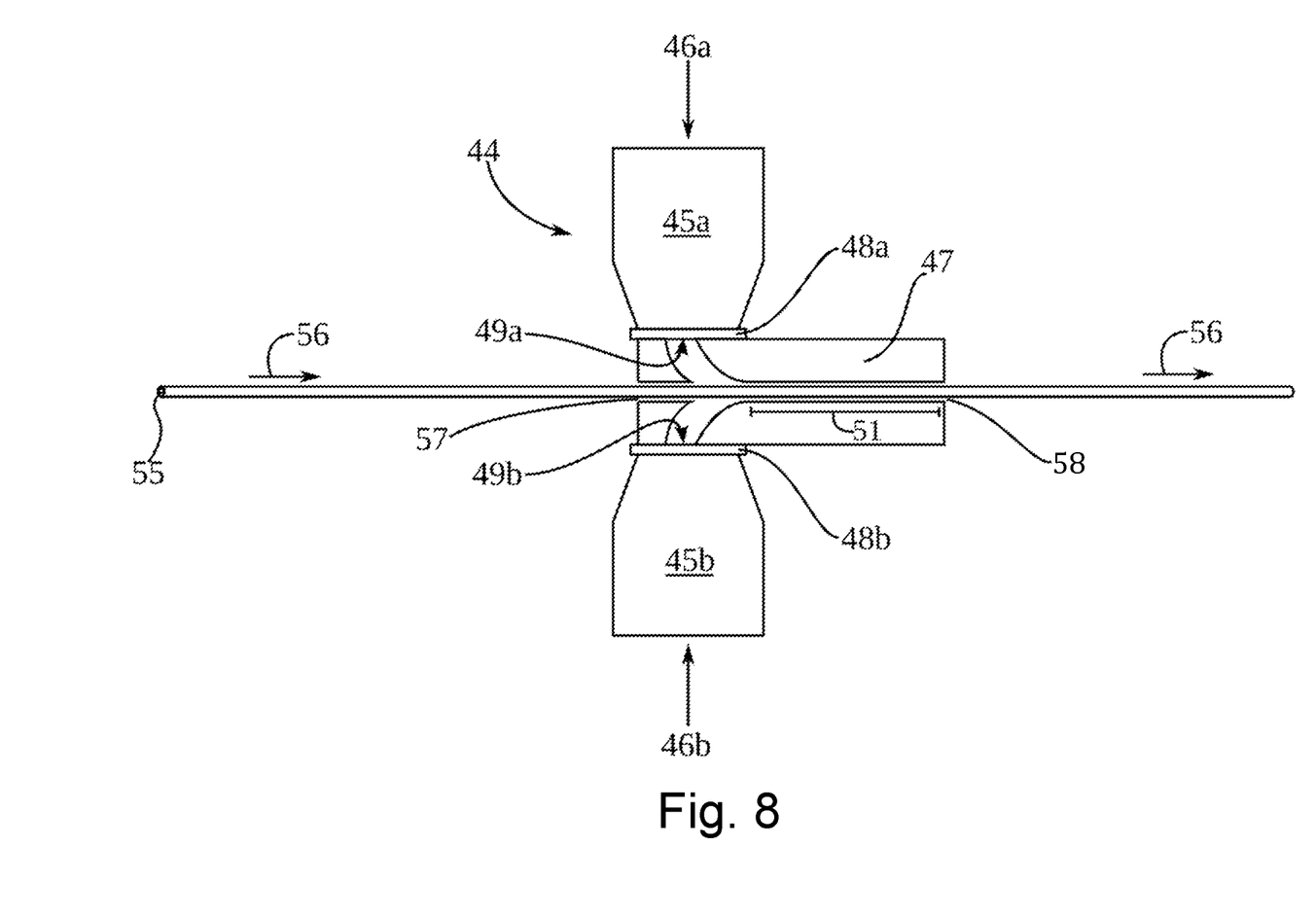
FIG. 8 illustrates a cross sectional view of an apparatus with a shield in accordance with the present invention, which is particularly preferred for plasma coating of a fiber.

FIG. 8 illustrates a cross sectional view of an apparatus with a shield in accordance with the present invention, which is particularly preferred for plasma coating of a fiber.

The setup is similar as for example 5. A fiber (55) is pulled through a coating apparatus (44) with a first plasma jet generator (45a) and a second plasma jet generator (45b) to which an inert gas and an aerosol comprising the precursor are provided (46a, 46b). A shield (47) is detachably attached to the jet outlets of both plasma jet generators (45a, 45b) by two adaptors (48a, 48b), whereby the jet inlets (49a, 49b) of the shield are brought in communication with the jet outlets of the plasma jet generators. The fiber runs along a longitudinal direction (56) from an object inlet edge (57) which is circumferentially congruent to the fiber, through the plasma, and continues to be exposed to the plasma for a certain length (51). The fiber leaves the shield through an object outlet edge (58) which is circumferentially congruent to the fiber. The coated powder can be returned to the inlet (57) for further coating cycles.

Example 7: Rotational Coating

Figure 9:
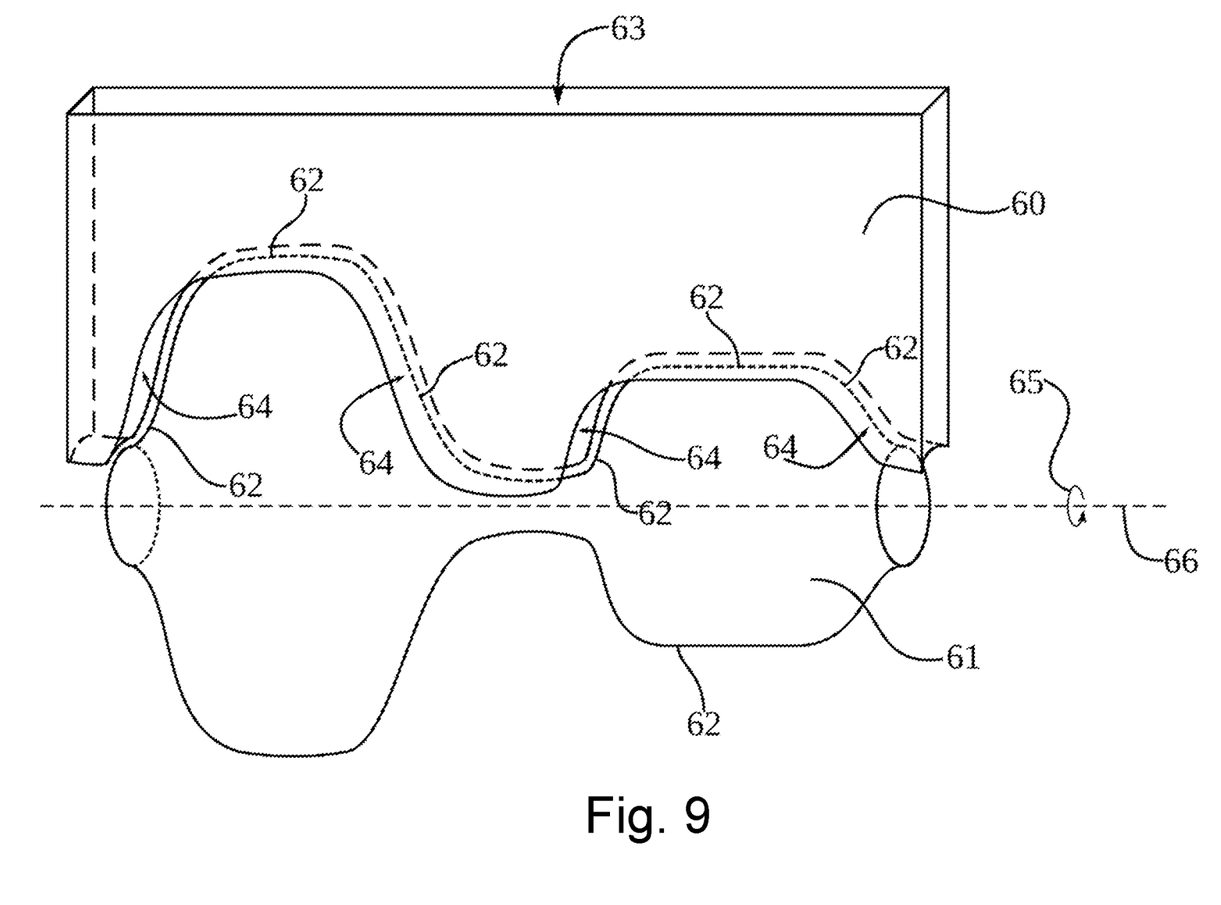
FIG. 9 illustrates a perspective view of a shield in accordance with the present invention, with an edge which is particularly manufactured to be congruent with an axially symmetric object.

FIG. 9 illustrates a perspective view of a shield in accordance with the present invention, with an edge which is particularly manufactured to be congruent with an axially symmetric object.

The shield (60) is particularly manufactured to treat the axially symmetric object (61), comprising a radial profile (62). The shield (60) thereby comprises a jet inlet (63) and a nozzle outlet comprising an edge (64) which is congruent with the radial profile (62). During subjecting the object's surface to the plasma, the object is rotated (65) around its central axis (66). The shield may have a flange near the jet inlet for easy and datable attachment to the jet outlet of a plasma jet generator, e.g. as in previous examples or as shown more clearly in FIGS. 1A-5B. Note that in FIG. 9, the object's surface can be slightly inserted into the edge (64) to minimize the gap between object and shield.

The invention claimed is:

1. A method for plasma coating an object comprising an object profile, comprising the steps of:
    (a) manufacturing a replaceable shield comprising a jet inlet, a nozzle outlet and a sidewall extending from the jet inlet to the nozzle outlet, wherein the nozzle outlet comprises an edge essentially congruent to at least part of the object profile;
    (b) detachably attaching the replaceable shield to a jet outlet of a plasma jet generator;
    (c) placing the object at the nozzle outlet such that the object profile fits closely to the nozzle outlet edge, thereby minimizing a gap between the nozzle outlet and the object;
    (d) plasma coating the object with a low-temperature, oxygen-free plasma at an operating pressure which is higher than the atmospheric pressure, by at most 10%, by providing a plasma jet in the shield via the plasma jet generator and injecting coating precursors in the plasma jet in the shield, thereby creating said operating pressure, thereby plasma coating the object in an oxygen-depleted plasma zone;
    wherein a temperature of the plasma in step(d) is lower than 120° C.

2. The method according to claim 1, wherein the shield is detachably attached to the jet outlet by an adaptor configured for detachably attaching the shield onto the plasma jet generator and thereby communicatively coupling the jet outlet of the plasma jet generator and the jet inlet of the shield.

3. The method according to claim 1, the method further comprising:
    performing step (a) for each of multiple types of objects, each type of object comprising a different object profile,
    wherein multiple replaceable shields are manufactured, each shield comprising a nozzle outlet with nozzle outlet edge essentially congruent to at least part of the object profile of the respective object.

4. The method according to claim 1, wherein the sidewall of the shield comprises at least one precursor inlet, and
    wherein said coating precursors are injected via said at least one precursor inlet in the plasma jet in the shield.

5. The method according to claim 1, wherein step (d) comprises the step of:
    (e) relatively moving a surface of the object and the nozzle outlet for depositing a coating on said surface,
    wherein during step (e) of relatively moving a surface of the object and the nozzle outlet for depositing a coating on said surface, said edge is maintained at a distance of at least 0.1 mm and at most 5 mm of said surface of said substrate, and thereby depositing a coating on said surface.

6. The method according to claim 5, wherein the object profile is essentially the same along a longitudinal direction and said relative movement comprises a relative translation along said longitudinal direction,
    wherein said edge is a first edge which is circumferentially congruent to the object profile, and
    wherein said shield comprises a second edge which is an object inlet edge which is circumferentially congruent to the object profile, and
    wherein said relative movement comprises movement of the object in the longitudinal direction from the object inlet edge to the first edge through a treatment chamber within said shield.

7. The method according to claim 5, wherein the object profile is essentially axially symmetric around a central axis and said relative movement comprises a relative rotation around said central axis.

8. The method according to claim 6, wherein:
    the object is a fiber with a profile comprising an essentially circular cross section which is the same in a longitudinal direction, wherein the first edge and the second edge comprise a circular opening having a diameter congruent to the cross section of the fiber, thereby allowing passage of the fiber through the openings of said first and second edges, or
    the object is a powder which is blown along a longitudinal directional, thereby forming a powder beam having a profile comprising an essentially circular cross section with a diameter which is the same in a longitudinal direction or which varies in the longitudinal direction, wherein the first edge and the second edge comprise a respective circular opening having respective diameters congruent to the cross section of the powder beam at the position of the first edge and the second edge respectively, thereby allowing passage of the powder through the openings of said first and second edges.

9. The method according to claim 1, wherein said manufacturing the replaceable shield further comprises forming the replaceable shield by 3D printing.

* * * * *